US012750049B2

(12) United States Patent
Zhu et al.

(10) Patent No.: US 12,750,049 B2
(45) Date of Patent: Sep. 29, 2026

(54) MULTI-LEVEL DI/DI CONTROL OF A POWER SEMICONDUCTOR DEVICE

(71) Applicants: NEXPERIA B.V, Nijmegen (NL); Nexperia Technology (Shanghai) Ltd., Shanghai (CN)

(72) Inventors: Shiwu Zhu, Manchester (GB); Chunlin Zhu, Manchester (GB); Ke Jiang, Shanghai (CN)

(73) Assignees: Nexperia B.V., Nijmegen (NL); Nexperia Technology (Shanghai) Ltd., Shanghai (CN)

( * ) Notice: Subject to any disclaimer, the term of this patent is extended or adjusted under 35 U.S.C. 154(b) by 1 day.

(21) Appl. No.: 18/959,942

(22) Filed: Nov. 26, 2024

(65) Prior Publication Data

US 2025/0175174 A1 May 29, 2025

(30) Foreign Application Priority Data

Nov. 28, 2023 (EP) .................................... 23212581

(51) Int. Cl.
*H03K 17/16* (2006.01)
*H03K 17/082* (2006.01)

(52) U.S. Cl.
CPC ....... *H03K 17/168* (2013.01); *H03K 17/0828* (2013.01)

(58) Field of Classification Search
CPC ............. H03K 17/168; H03K 17/0828; H03K 17/165; H03K 17/162; H03K 17/0822;
(Continued)

(56) References Cited

U.S. PATENT DOCUMENTS 8,890,596 B2 * 11/2014 Chen .................... H03K 5/1252 327/296
2012/0256493 A1 10/2012 Saito
(Continued)

FOREIGN PATENT DOCUMENTS

JP 2014120563 6/2014

OTHER PUBLICATIONS

Extended European search report for corresponding European patent application EP23212581.5, 8 pages, dated May 21, 2024.

*Primary Examiner* — Jung Kim
(74) *Attorney, Agent, or Firm* — Ruggiero McAllister & McMahon LLC

(57) ABSTRACT

A power semiconductor device has a power semiconductor die forming a power switch with an input pad, an output pad, and a control pad; a collector power terminal coupled to the input pad of the power switch; an auxiliary gate terminal coupled to the control pad of the power switch; an emitter power terminal; two or more inductance/resistance pairs, with each inductance/resistance pair having a common stray inductance and a resistance arranged in series between the output pad of the power switch and the emitter power terminal; and a plurality of auxiliary emitter terminals that are coupled to both sides of the inductance/resistance pairs so that one auxiliary emitter terminal is coupled to one side of one inductance/resistance pair. A control circuit for di/dt control can control the power semiconductor device. An electronic device can include the power semiconductor device and control circuit.

14 Claims, 7 Drawing Sheets

(58) Field of Classification Search
CPC .... H03K 17/567; H03K 17/687; H03K 17/16; H03K 17/082; H03K 17/08; H03K 17/161; H03K 17/166; H03K 17/163; H03K 17/0826; H03K 17/60; H03K 17/602; H03K 17/603; H03K 17/62; H03K 17/6221; H03K 17/6285; H03K 17/64
See application file for complete search history.

(56) References Cited

U.S. PATENT DOCUMENTS

| | | | |
|---|---|---|---|
| 2017/0187372 | A1* | 6/2017 | Perruchoud ....... H01L 23/49562 |
| 2017/0248646 | A1 | 8/2017 | Mauder et al. |

* cited by examiner

1100

MULTI-LEVEL DI/DI CONTROL OF A POWER SEMICONDUCTOR DEVICE

CROSS-REFERENCE TO RELATED APPLICATIONS

This application claims priority under 35 U.S.C. § 119 to European patent application EP 23212581.5, filed Nov. 28, 2023, the entire disclosure of which is incorporated herein by reference.

BACKGROUND OF THE DISCLOSURE

1. Field of the Disclosure

The present disclosure relates to a power semiconductor device, a control circuit for di/dt control of a power semiconductor device, an electronic device including such power semiconductor device and such control circuit, and a method of multi-level di/dt control of a power semiconductor device.

2. Description of Related Art

Power semiconductor based switches, such as insulated-gate bipolar transistors (IGBTs), silicon carbide (SiC) metal-oxide semiconductor field-effect transistors (MOSFETs), gallium nitride (GaN) semiconductor devices, and etcetera, are typically designed to switch as fast as possible to achieve minimum turn-on and turn-off power losses. However, when a freewheeling diode (also known as flyback diode) is used with the switch, at turn-on transient, the freewheeling diode typically requires a slow transition to reduce the reverse recovery current and diode transition power loss. At turn-off, the power semiconductor device typically requires a low overshoot voltage to avoid avalanche breakdown which needs to slow down the turn-off transient. A power semiconductor device typically includes one or more of such semiconductor-based switches.

Known power semiconductor devices use fixed-value gate resistors to achieve the above engineering objective. However, such fixed-value gate resistor-based solution needs to compromise switching performance between low and high switching currents. Alternative solutions are known that use a closed-loop gate drive control method, which can realize good control of the switching transient. However, such closed-loop control circuit typically requires very high design bandwidth, resulting in stability, complexity and reliability challenges in designing and applying such circuits.

SUMMARY OF THE DISCLOSURE

A summary of aspects of certain examples disclosed herein is set forth below. It should be understood that these aspects are presented merely to provide the reader with a brief summary of these certain embodiments and that these aspects are not intended to limit the scope of this disclosure. Indeed, this disclosure can encompass a variety of aspects and/or a combination of aspects that are not set forth.

According to an aspect of the present disclosure, a power semiconductor device is presented. The power semiconductor device can include a power semiconductor die forming a power switch. The power switch can include an input pad, an output pad and a control pad. The power semiconductor device can further include a collector power terminal coupled to the input pad of the power switch. The power semiconductor device can further include an auxiliary gate terminal coupled to the control pad of the power switch. The power semiconductor device can further include an emitter power terminal. The power semiconductor device can further include two or more inductance/resistance pairs, wherein each inductance/resistance pair includes a common stray inductance and a resistance which are arranged in series between the output pad of the power switch and the emitter power terminal. The power semiconductor device can further include a plurality of auxiliary emitter terminals. The auxiliary emitter terminals can be coupled to both sides of the inductance/resistance pairs so that one auxiliary emitter terminal is coupled to one side of one inductance/resistance pair.

In an embodiment, the common stray inductance and the resistance can be formed by wire bonds and/or substrate copper tracks.

In an embodiment, a first inductance value of the common stray inductance and/or a first resistance value of the resistance is the same in different inductance/resistance pairs.

In an embodiment, a second inductance value of the common stray inductance and/or a second resistance value of the resistance is different in different inductance/resistance pairs.

In an embodiment, a plurality of power semiconductor dies can form a plurality of power switches.

In an embodiment, the power semiconductor device can further include a device package. The collector power terminal, the auxiliary gate terminal, the emitter power terminal and the plurality of auxiliary emitter terminals can extend through the device package.

According to an aspect of the present disclosure, a control circuit for di/dt control of a power semiconductor device is presented. The power semiconductor device can include one or more of the above-described features. The control circuit can be arranged to be coupled to a plurality of inductance/resistance pairs of the power semiconductor device. The control circuit can be arranged to form a gate drive current return loop through an inductance/resistance pair. The control circuit can be arranged to select the inductance/resistance pair. Thus, multi-level di/dt control can be achieved.

In an embodiment, the control circuit can include a plurality of electronics switches. Each electronic switch can be arranged to be coupled to one side of one inductance/resistance pair.

In an embodiment, the control circuit can further include an input arranged to receive a di/dt selection input signal. The control circuit can further include a demultiplexer circuit arranged to receive the di/dt selection input signal via the input and coupled to the plurality of electronics switches. The control circuit can further include one or more oscillation damp resistors coupled between the electronics switches and a gate drive power supply ground.

The control circuit can further include an input arranged to receive a di/dt selection input signal. The control circuit can further include a demultiplexer circuit arranged to receive the di/dt selection input signal via the input and coupled to the plurality of electronics switches. The control circuit can further include one or more oscillation damp resistors coupled between the electronics switches and a gate drive power supply ground. The control circuit can further include a diode. One side of the diode can be arranged to be coupled to one side of a first of the inductance/resistance pairs. The one side of the first of the inductance/resistance pairs can be coupled to an output pad of a power switch of the power semiconductor device. The other side of the diode can be coupled to the gate drive power supply ground.

In an embodiment, the one side of the diode can be an anode of the diode.

In another embodiment, the one side of the diode can be a cathode of the diode.

The control circuit can further include a first input arranged to receive di/dt reference input signal. The control circuit can further include a second input arranged to receive a di/dt feedback signal. The control circuit can further include a di/dt process logic circuit arranged to receive the di/dt reference input signal via the first input. The control circuit can further include a demultiplexer circuit coupled to the di/dt processing logic circuit and coupled to the plurality of electronics switches. The control circuit can further include one or more oscillation damp resistors coupled between the electronics switches and a gate drive power supply ground. The control circuit can further include a di/dt detect circuit arranged to receive the di/dt feedback signal via the second input and arranged to be coupled to one side of a first of the inductance/resistance pairs. The one side of the first of the inductance/resistance pairs can be coupled to an output pad of a power switch of the power semiconductor device. The control circuit can further include an error amplify circuit arranged to receive the di/dt reference input signal via the first input and arranged to receive the di/dt feedback signal via the second input. The error amplify circuit can be coupled to a gate drive circuit for gate drive level close loop di/dt control.

According to an aspect of the present disclosure, an electronic device is presented. The electronic device can include a power semiconductor device having one or more of the above-described features. The electronic device can further include a control circuit having one or more of the above-described features.

In an embodiment, the electronic device can further include a gate drive circuit arranged to be coupled to an input pad and a control pad of a power switch of the power semiconductor device.

BRIEF DESCRIPTION OF THE DRAWINGS

Embodiments of the present disclosure will now be described, by way of example only, with reference to the accompanying schematic drawings in which corresponding reference symbols indicate corresponding parts.

Figure 1:
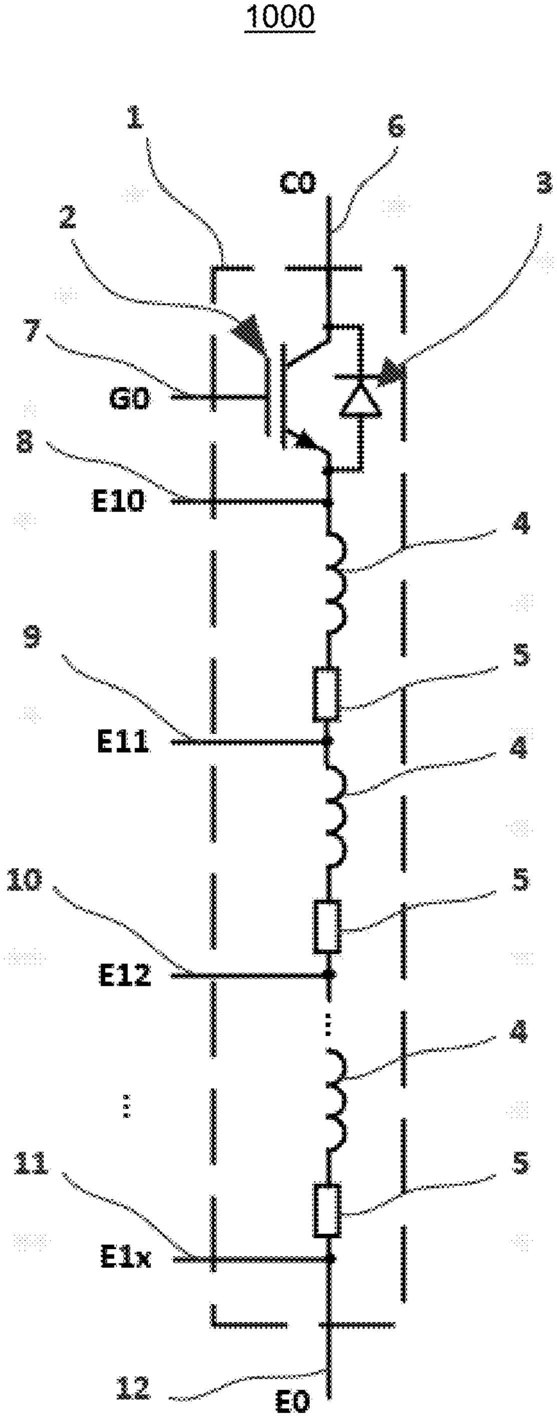
FIG. 1 shows an example circuit diagram of a power semiconductor device.

The figures are intended for illustrative purposes only and do not serve as a restriction of the scope of the protection as laid down by the claims.

DETAILED DESCRIPTION OF THE DISCLOSURE

It will be readily understood that the components of the embodiments, as generally described herein and illustrated in the appended figures, could be arranged and designed in a wide variety of different configurations. Thus, the following more detailed description of various embodiments, as represented in the figures, is not intended to limit the scope of the present disclosure but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the present disclosure is, therefore, indicated by the appended claims rather than by this detailed description. All changes that come within the meaning and range of equivalency of the claims are to be embraced within their scope.

Reference throughout this specification to features, advantages, or similar language does not imply that all of the features and advantages that can be realized with the present disclosure should be or are in any single example of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification can, but do not necessarily, refer to the same example.

Furthermore, the described features, advantages, and characteristics of the present disclosure can be combined in any suitable manner in one or more embodiments. One skilled in the relevant art will recognize, in light of the description herein, that the present disclosure can be practiced without one or more of the specific features or advantages of a particular embodiment. In other instances, additional features and advantages can be recognized in certain embodiments that are not present in all embodiments of the present disclosure. Reference throughout this specification to "one embodiment," "an embodiment," or similar language means that a particular feature, structure, or characteristic described in connection with the indicated embodiment is included in at least one embodiment of the present disclosure. Thus, the phrases "in one embodiment," "in an embodiment," and similar language throughout this specification can, but do not necessarily, all refer to the same embodiment.

Di/dt control, often referred to as di/dt protection or current slew rate control, is a technique used in power electronics and power semiconductor devices to limit the rate of change of current (di/dt) during switching transitions. It can be employed to manage and reduce electromagnetic interference (EMI), minimize voltage spikes and ringing, and/or prevent excessive stress on components, especially in high-frequency applications. Di/dt control is commonly used in devices like MOSFETs, IGBTs and other power switches.

Di/dt control is especially important in applications where high-frequency switching is required, such as in switch-mode power supplies (SMPS), motor drives, and radio-frequency (RF) systems. By managing the rate of change of current, it helps to ensure that the system operates efficiently, reliably, and with reduced EMI, while also extending the lifespan of components.

Stray inductance in the context of MOSFETs, IGBTs, and other power semiconductor devices refers to parasitic inductance. This parasitic inductance can be present in various parts of the circuit and interconnections and can have an impact on the performance and switching characteristics of a power semiconductor device. Stray inductance can affect the switching speed and efficiency of a semiconductor device in high-frequency applications. When the power semiconductor device switches on or off, voltage spikes can be generated due to the rapid change in current. These voltage spikes can lead to ringing and can cause unwanted oscillations in the circuit. Stray inductance exacerbates these issues because it stores energy in the form of a magnetic field, and when the current changes quickly, it can induce voltage spikes and ringing.

This disclosure presents a semiconductor device including multiple gate drive auxiliary emitter terminals and a di/dt control circuit to utilize these auxiliary emitter terminals to realize substantially real-time multi-level di/dt control.

The solution of the present disclosure can utilize the negative feedback effect of a common stray inductance to the gate drive loop to realize the multi-levels of di/dt control. Here, the common stray inductance is the parasitic inductance coupled between the gate drive loop and power emitter path. This parasitic inductance can be created by wire bonds and/or copper tracks on the substrate.

Compared to conventional fixed-value gate resistor methods, the proposed solution advantageously reduces switching losses and turn on/off time delays. Furthermore, the proposed solution is less complex compared to, e.g., known closed-loop gate drive control solutions while being able to realize substantial real-time multi-level di/dt control with improved circuit stability and reliability.

FIG. 1 shows an example circuit diagram of a power semiconductor device 1000 according to an aspect of the present disclosure. The power semiconductor device 1000 can include a device package 1, one or more power semiconductor dies 2 and one or more freewheeling diode dies 3. The power semiconductor device 1000 of the present disclosure further includes two or more pairs of common stray inductance 4 and resistance 5, which can be created by wire bonds and/or substrate copper tracks. Between the pairs, the inductance 4 and/or resistance 5 values can be different. The power semiconductor device 1000 can further include a collector (C0) power terminal 6, an auxiliary gate (G0) terminal 7, an emitter power (E0) terminal 12, and a plurality of auxiliary emitter (E10-E1*x*) terminals 8-11. In the example of FIG. 1, a 1st auxiliary emitter terminal 8, a 2nd auxiliary emitter terminal 9, a 3rd auxiliary emitter terminal 10, and an x-th auxiliary emitter terminal 11 are shown, with x indicating that there can be any number of auxiliary emitter terminals.

The power switch can be formed by any semiconductor die 2, such as an IGBT, SiC MOSFET, GaN, and etcetera. The power switch typically includes an input pad, e.g., a collector in an IGBT or a drain in a MOSFET, an output pad, e.g., an emitter in an IGBT or a source in a MOSFET, and a control pad, e.g., a gate in an IGBT or in a MOSFET. In the following, the power semiconductor die and the power switch formed by the semiconductor die can both be referenced by the numeral "2". There can be a single power semiconductor die 2 integrated into the package 1. Alternatively, there can be multiple power semiconductor dies 2 integrated into the package 1, e.g., multiple semiconductor dies 2 in parallel or semiconductor dies 2 in series to form half-bridge or multi-level topologies.

The freewheeling diode die 3 forms a freewheeling diode. In the following, the freewheeling diode die and the freewheeling diode formed by the freewheeling diode die can both be referenced by the numeral "3".

The power switch 2 of the power semiconductor device 1000 typically includes a freewheeling diode 3, but it is possible that no freewheeling diode 3 is used with the power switch 2. In the latter example, the power semiconductor device 1000 can include a power semiconductor die 2 without a freewheeling diode die 3.

The auxiliary emitter terminals 8-11 provide a pin interface for di/dt control. Contrary to conventional semiconductor device that typically include a single auxiliary emitter terminal, the power semiconductor device 1000 of the present disclosure includes multiple auxiliary emitter terminals 8-11. Between the auxiliary emitter terminals 8-11, the parasitic inductances 4 and resistances 5 are pairwise coupled with the emitter current path from power semiconductor dies 2 and freewheeling diode dies 3 to power terminal 12, such as shown in FIG. 1. The number of auxiliary emitters terminals 8-11 is preferably three or more.

Figure 2:
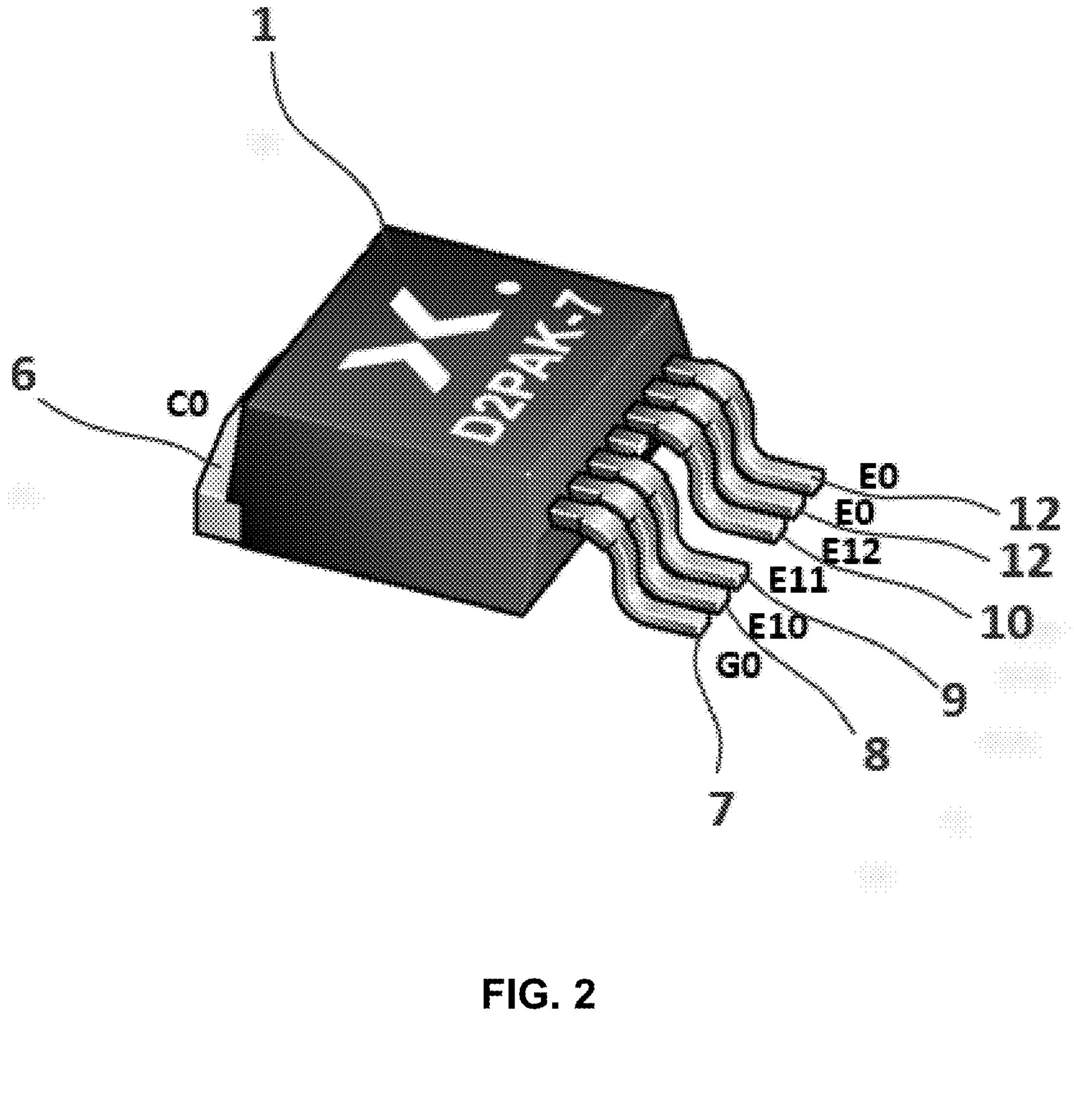
FIG. 2 shows a three-dimensional (3D) model of an example power semiconductor device.

FIG. 2 shows a 3D model of an example power semiconductor device 1100, which can be similar to the power semiconductor device 1000 of FIG. 1. In the example of FIG. 2, the power semiconductor device 1100 is an IGBT device with a D2PAK-7 package. The power semiconductor device 1100 of FIG. 2 includes a D2PAK-7 package body 1, a collector power (C0) terminal 6, an auxiliary gate (G0) terminal 7, an emitter power (E0) terminal 12, and a plurality of auxiliary emitter (E10-E12) terminals 8-10. In the example of FIG. 2, there are three auxiliary emitter terminals, namely a 1st auxiliary emitter terminal 8, 2nd auxiliary emitter terminal 9 and a 3rd auxiliary emitter terminal 10. The emitter power terminal 12 can include one or more pinouts. In the example of FIG. 2, the emitter power terminal 12 includes two pinouts to allow multiple connections to the same emitter power terminal 12. Power semiconductor dies 2, freewheeling diode dies 3, common stray inductances 4 and resistances 5 can be integrated in the package 1 but are not visible in the outside appearance of FIG. 2.

Figure 3A:
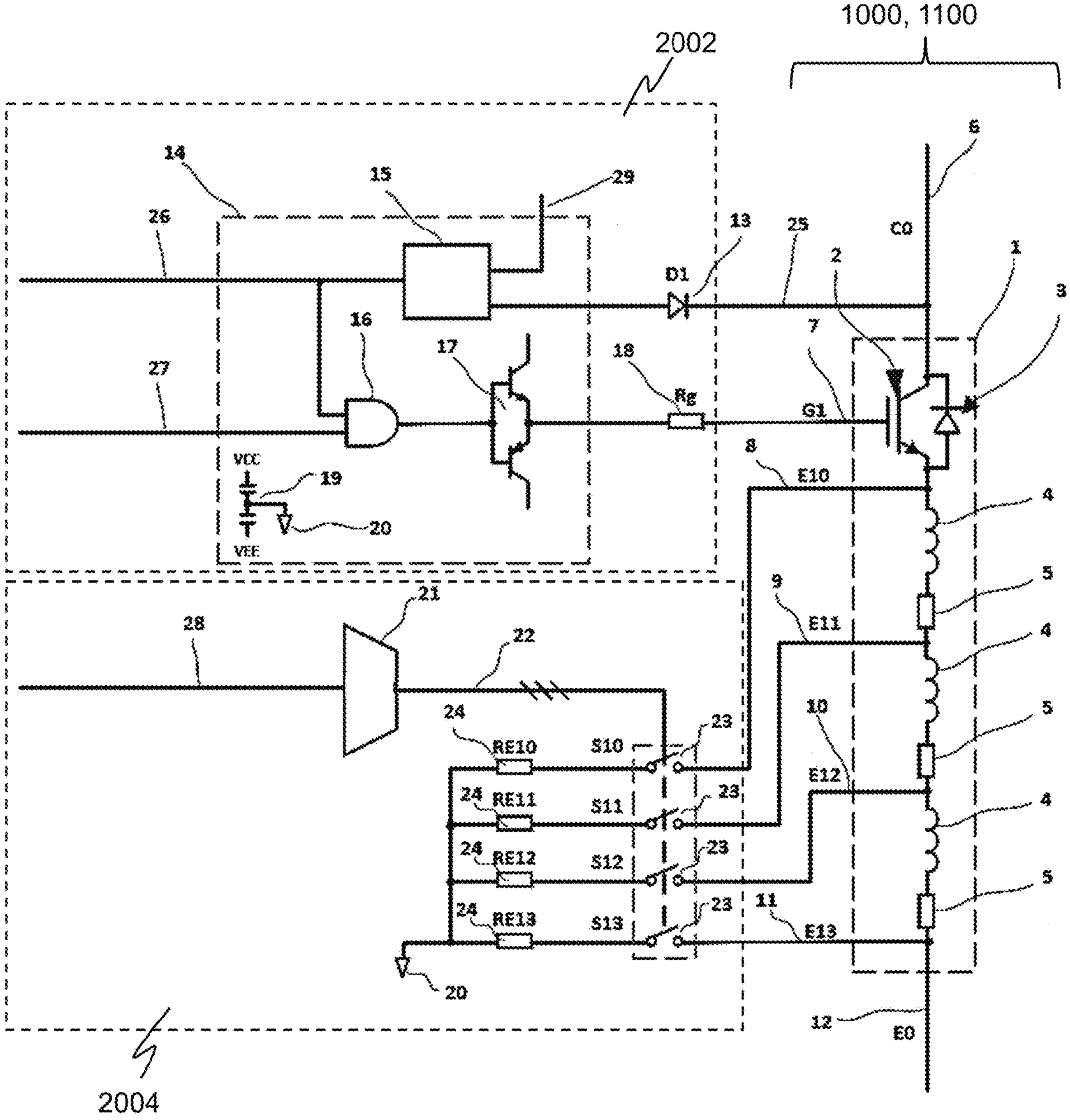
FIGS. 3A-3C show example embodiments of circuit diagrams for di/dt control of a semiconductor device.
Figure 3B:
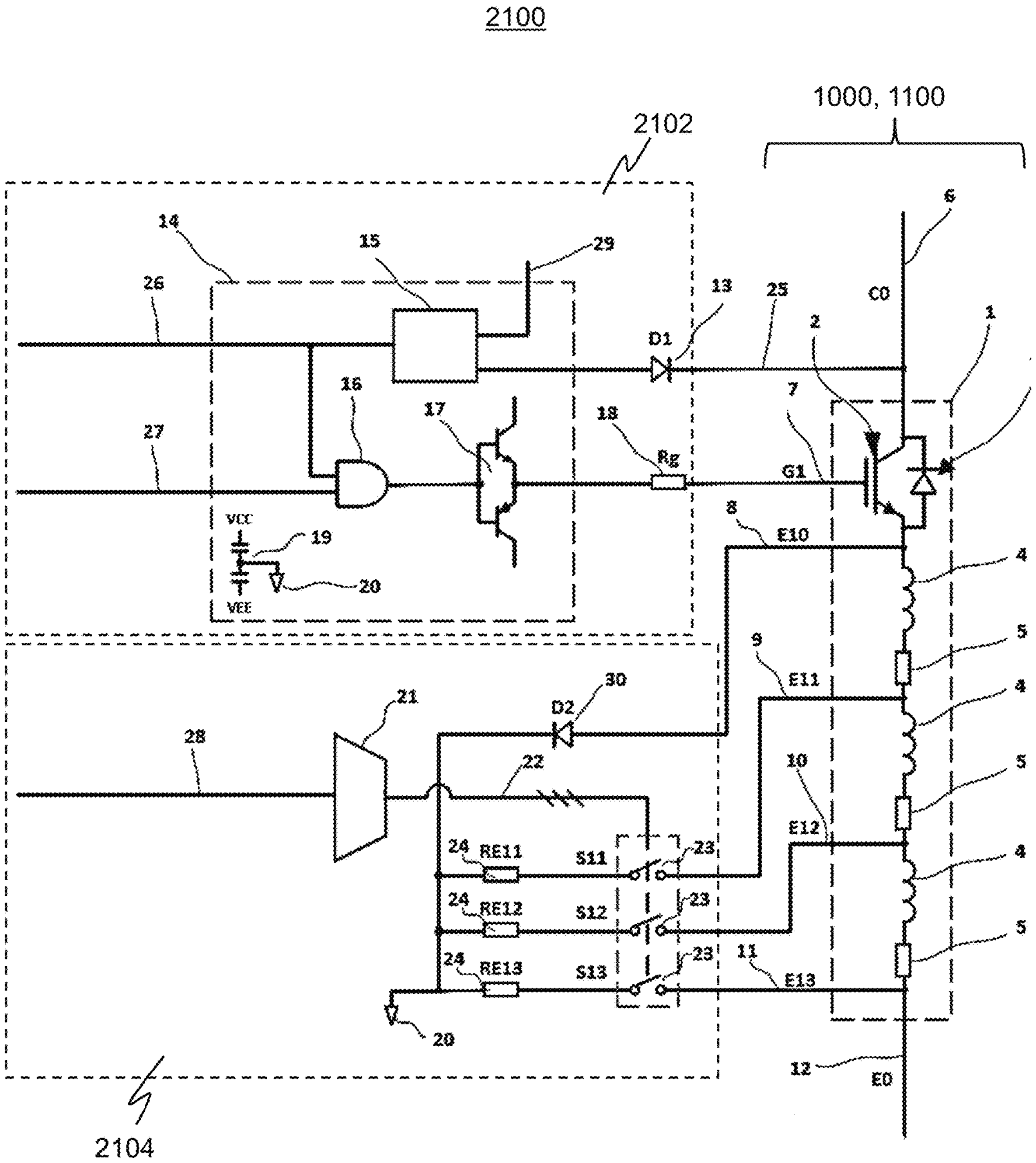
Figure 3C:
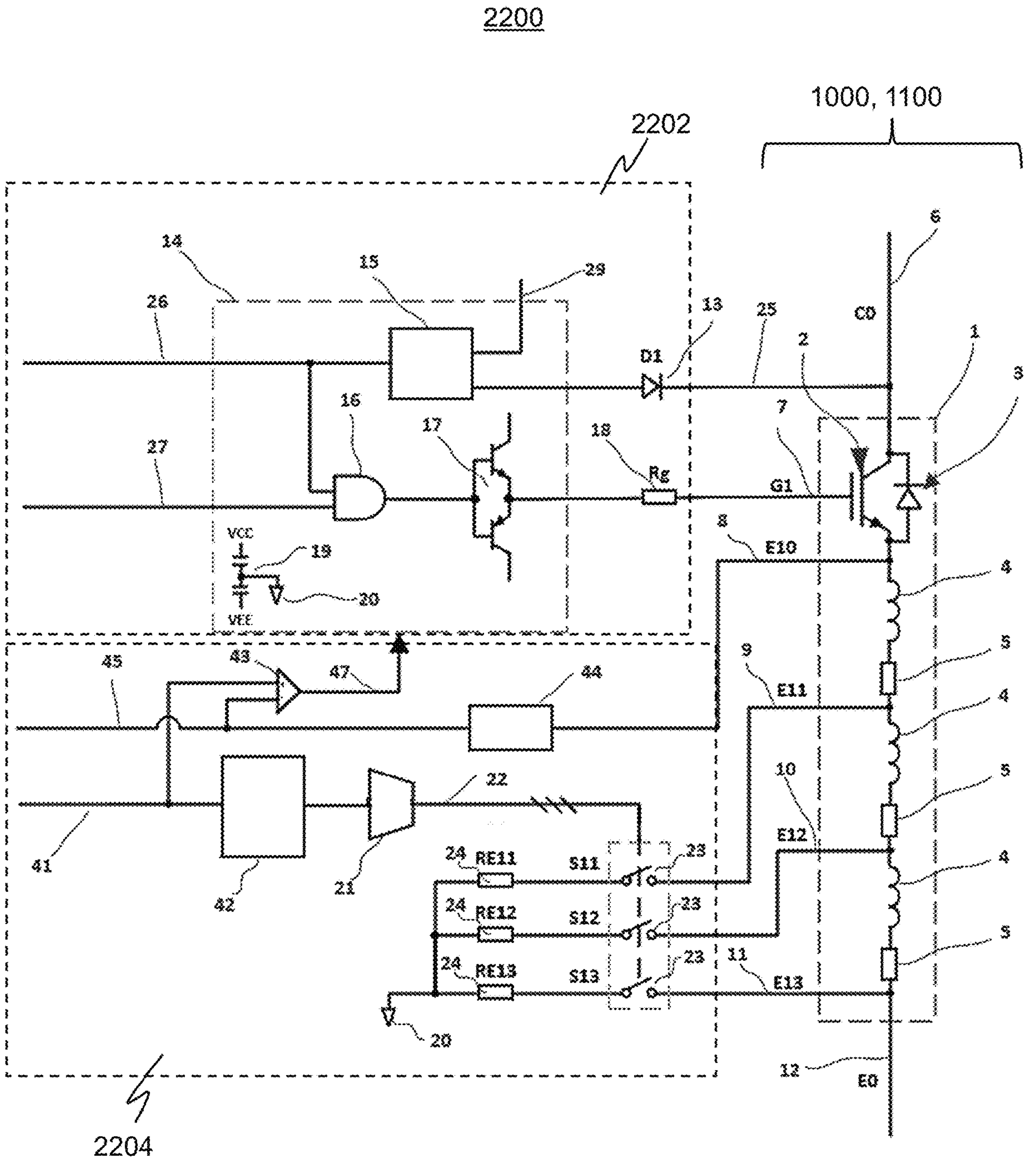

FIGS. 3A-3C show example embodiments of circuit diagrams for di/dt control of a semiconductor device, such as the power semiconductor device 1000 of FIG. 1 or the power semiconductor device 1100 of FIG. 2.

In FIGS. 3A-3C, the power semiconductor device components 1-12 form a semiconductor device such as the power semiconductor device 1000 of FIG. 1 or the power semiconductor device 1100 of FIG. 2. In the example of FIG. 3A, the auxiliary emitter terminals 8-11 can be used to realize a 4-level di/dt control. More generally, with x auxiliary emitter terminals, an x-level di/dt control can be realized.

The circuit diagram 2000 of FIG. 3A can include a gate drive circuit part 2002, which can be referred to as gate drive circuit. The gate drive circuit part 2002 can include: a gate drive protection signal feedback 26; a pulse-width modulation (PWM) control signal input 27; a temperature sensor input 29; a gate drive circuit block 14 which is comprised of protection logic circuit 15, PWM input and protection logic AND 16, push-pull output 17, power supply 19 and power supply ground 20; a high voltage drop-down diode 13; a power semiconductor collector voltage feedback 25 and a gate resistor 18. The gate drive circuit part 2002 can be based on a conventional gate drive circuit.

The circuit diagram of FIG. 3A can further include a di/dt control circuit part 2004, which can be referred to as control circuit. The di/dt control circuit part 2004 can include: a di/dt selection input signal 28; a demultiplexer circuit 21, electronics switches 23 and multiple connection lines 22 between the demultiplexer circuit 21 and the electronics switches 23; and oscillation damp resistor 24.

The gate drive circuit part 2002 drives the power switch 2 through gate drive circuit block 14 and gate resistor 18 according to the PWM input signal 27. The di/dt control circuit part 2004 creates the gate drive current return loop from gate drive power supply 19 to the power supply ground 20, which flows through one of the branches with common stray inductance 4 and resistance 5. Branch selection can be performed by demultiplexer circuit 21 and electronics switches 23 according to the di/dt selection input 28. Since the common stray inductance 4 and resistance 5 are coupled with the emitter current path from power semiconductor die(s) 2 and freewheeling diode die(s) 3 to power terminal 12, there is a voltage drop generated on the common stray inductance 4 and resistance 5 due to current change (or di/dt) in the emitter current path during turn-on and turn-off transitions. Since the voltage drop plays a negative effect on the gate drive loop for the semiconductor device, it helps to slow down and stabilize the turn-on and turn-off current transition speed, which establishes a stable di/dt value. In the four auxiliary emitter terminals 8-11, auxiliary emitter terminal 8 provides the fastest turn-on and turn-off speed, which generates the highest di/dt value. Auxiliary emitter terminal 9 provides the 2nd fastest turn-on and turn-off speed and 2nd highest di/dt value. While auxiliary terminals 10 and 11 provide the 3rd and 4th highest di/dt value, respectively.

The circuit diagram 2100 of FIG. 3B is similar to the circuit diagram 2000 of FIG. 3A and includes a gate drive circuit part 2102, similar to the gate drive circuit part 2002, and an alternative di/dt control circuit part 2104.

In the example of FIG. 3B, the electronics switch 23 connected with auxiliary emitter terminal 8 in FIG. 3A has been modified to a diode 30. When the anode of diode 30 is connected with auxiliary emitter terminal 8 of the power semiconductor device 1000, 1100 (this is the configuration as shown in FIG. 3B), the turn-on transient has the fastest transition speed and highest di/dt, and the di/dt control circuit part 2104 only influences the turn-off transition. When the cathode of diode 30 is connected with auxiliary emitter terminal 8 of the semiconductor device 1000, 1100 (not shown), the turn-off transient has the fastest transition speed and highest di/dt, and di/dt control circuit part 2104 would only influence the turn-on transition. In this way, the turn-on and turn-off transient can be decoupled from each other and a circuit designer can choose which transient is going to be designed with di/dt control.

The circuit diagram 2200 of FIG. 3C is similar to the circuit diagram 2100 of FIG. 3B and includes a gate drive circuit part 2202, similar to the gate drive circuit part 2102, and an alternative di/dt control circuit part 2204.

In the example of FIG. 3C, the gate drive circuit part 2204 realizes both converter system level di/dt control and gate drive level closed loop di/dt control. As shown in FIG. 3C, a di/dt detect circuit 44, a di/dt process logic circuit 42 and an error amplify circuit 43 are added in the di/dt control circuit part 2204. A di/dt reference input 41 feed into di/dt process logic 42, which determines one of the feedback branches from auxiliary emitter terminals 9-11 to be used. Then the output of di/dt process logic circuit 42 controls the electrics switches 23 to turn on through demultiplexer circuit 21. In this way, the converter system can select the proper di/dt feedback strength through the common stray inductance 4 and resistance 5 and checks the output through di/dt feedback 45. This realizes a converter system level di/dt control.

Moreover, in the example of FIG. 3C, the di/dt reference input 41 feeds into the positive input of an error amplify 43. The di/dt feedback signal 45 which is detected by di/dt detecting circuit 44 through auxiliary emitter terminal 8 is fed into the negative input of the error amplify 43. The output signal 47 of the error amplify 43 is then taken into the gate drive circuit block 14. This is a gate drive level close loop di/dt control which can provide faster and more accurate di/dt control.

The gate drive circuit part 2002, 2102, 2202, the di/dt control circuit part 2004, 2104, 2204, and the power semiconductor device 1000, 1100, such as shown in the circuit diagrams 2000, 2100, 2200 of FIGS. 3A-3C, can be integrated into an electronic device (not shown).

Figure 4A:
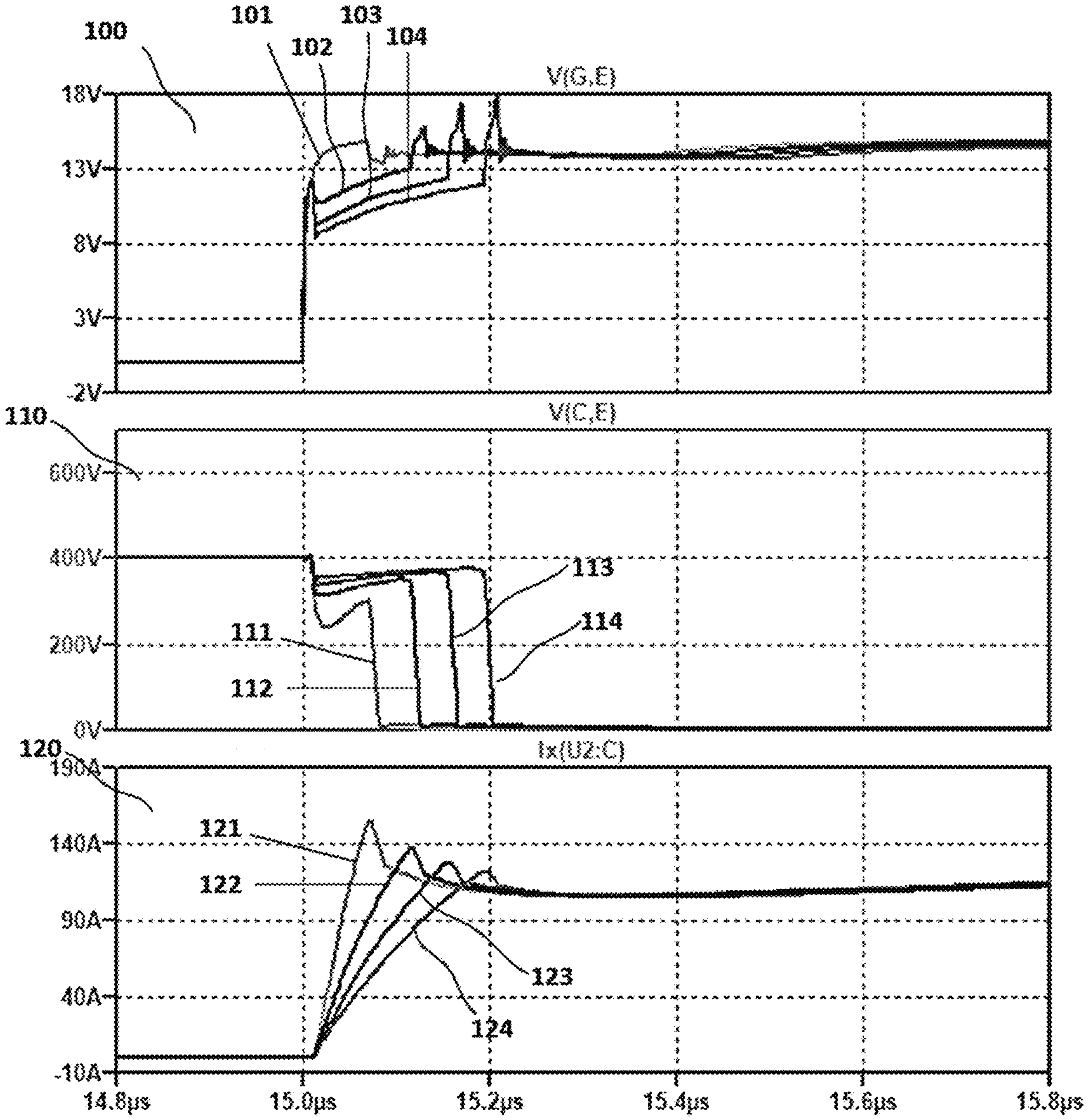
FIGS. 4A-4B show graphs of validation results for the configuration as shown in FIG. 3A.
Figure 4B:
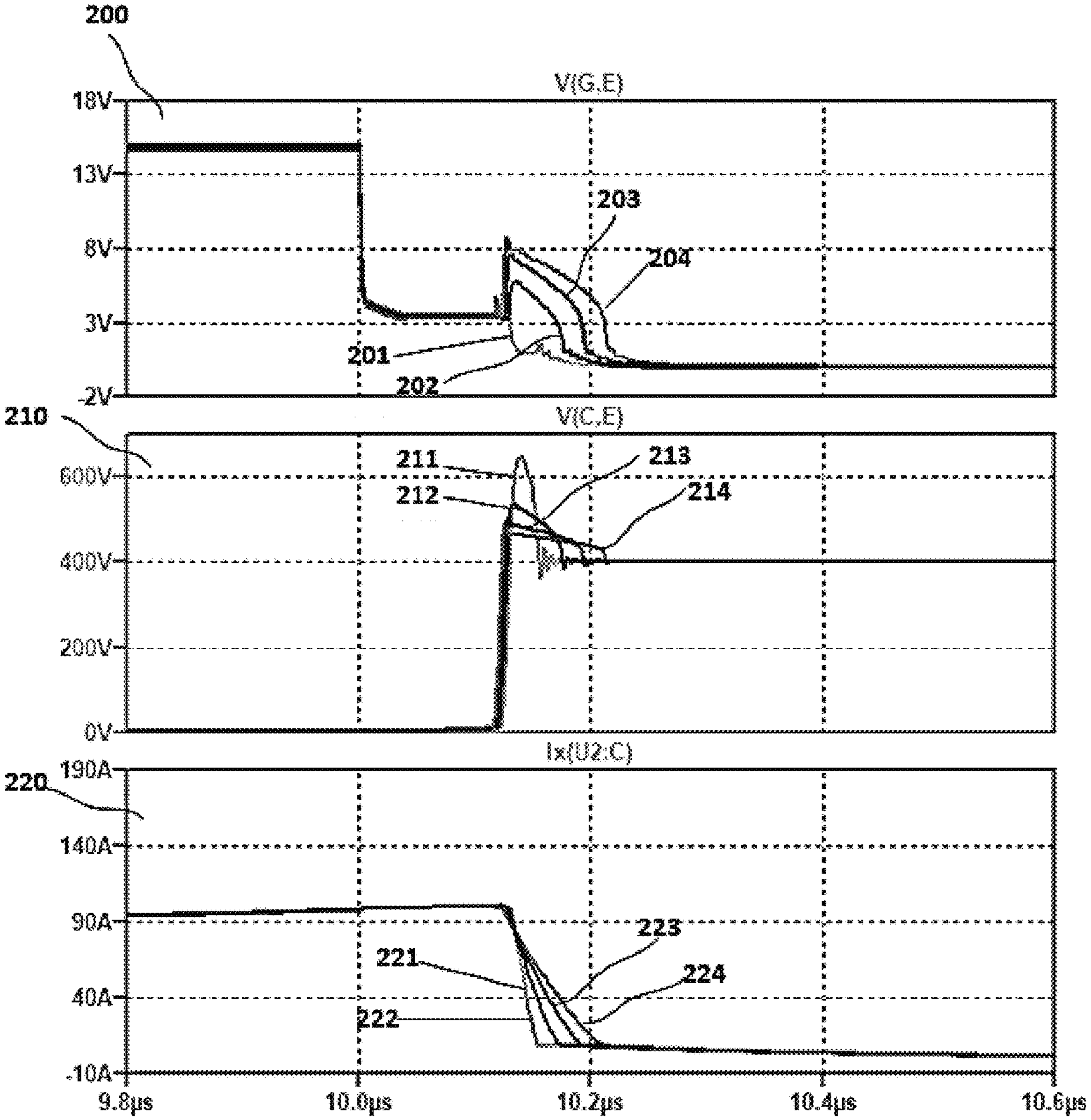

FIG. 4A and FIG. 4B are graphs showing validation results of the configuration as shown in FIG. 3A. Similar validation results can be obtained for the configurations as shown in FIG. 3B or FIG. 3C. The validation has been performed using a simulation of the circuit diagram 2000 in 'Simulation Program with Integrated Circuit Emphasis' (SPICE) simulator software LTSpice® and with a 650V/100 A IGBT device 2. Four auxiliary emitter terminals 8-11 as shown in FIG. 3A are used. For each common stray inductance 4 a 2 nH inductance and for each resistance 5 a 10 mΩ resistance is used.

FIG. 4A and FIG. 4B present the turn-on and turn-off waveforms. Plots 100 and 200 represent the voltages between gate and emitter pads on semiconductor dies 2, plots 110 and 210 represent the voltages between collector and emitter pads, and plots 120 and 220 represent the current flows into the collector pad of semiconductor dies 2. Waveforms 101, 111, 121, 201, 211, 221 are recorded with the di/dt control circuit connected to auxiliary emitter terminal 8, which has the fastest transition speed and highest di/dt. Waveforms 102, 112, 122, 202, 212, 222 are recorded with the di/dt control circuit connected to auxiliary emitter terminal 9, waveforms 103, 113, 123, 203, 213, 223 are recorded with the di/dt control circuit connected to auxiliary emitter terminal 10 and waveforms 104, 114, 124, 204, 214, 224 are recorded with the di/dt control circuit connected to auxiliary emitter terminal 11, which generate the 2nd, 3rd and 4th fastest transition speed and highest di/dt, respectively.

At turn-on transient, di/dt are adjusted successfully as shown in plot 120, while no obvious influence on dv/dt as plotted in 110 or turn-on gate voltage delay as shown in plot 100. Similarly at turn-off transient, di/dt is adjusted as shown in plot 220, with no obvious changes of dv/dt as shown in 210. It is worth to notice that the overshoot voltage can be reduced greatly from 630V to 430V. Further, there is no turn-off gate voltage delay as shown in plot 200.

Table 1 presents detailed numerical results for the simulation validation as illustrated in FIG. 4, where for two scenarios (i.e., a di/dt of 1.6-2.0 kA/us and a di/dt of 1.1-1.3 kA/us) validation data of a solution of the present disclosure (highlighted by thick border) is compared against a conventional fixed-gate resistor-based solution (non-highlighted column). The present disclosure is not limited to the scenarios and validation data of Table 1, which are presented as mere examples.

TABLE 1

| | di/dt: 1.6-2.0 kA/us | | di/dt: 1.1-1.3 kA/us | |
|---|---|---|---|---|
| | Rg_on = 2 Ω<br>Rg_off = 2 Ω<br>Les = 2 nH<br>Res = 10 mΩ | Rg_on = 16 Ω<br>Rg_off = 13 Ω | Rg_on = 2 Ω<br>Rg_off = 2 Ω<br>Les = 4 nH<br>Res = 10 mΩ | Rg_on = 29 Ω<br>Rg_off = 29 Ω |
| tdon, ns | 15.0 | 35.8 | 15.6 | 56.8 |
| tr, ns | 24.1 | 28.0 | 35.0 | 40.8 |
| Eon, mJ | 0.885 | 1.452 | 1.194 | 2.471 |
| di/dt_rise, kA/us | 1.6 | 1.6 | 1.1 | 1.1 |
| dv/dt_fall, kV/us | 35.8 | 11.8 | 37.4 | 7.2 |
| tdoff, ns | 184.4 | 432.3 | 183.2 | 823.3 |
| tf, ns | 25.7 | 26.5 | 36.9 | 47.7 |
| Eoff, mJ | 0.802 | 1.001 | 0.901 | 1.473 |

TABLE 1-continued

| | di/dt: 1.6-2.0 kA/us | | di/dt: 1.1-1.3 kA/us | |
|---|---|---|---|---|
| | Rg_on = 2 Ω Rg_off = 2 Ω Les = 2 nH Res = 10 mΩ | Rg_on = 16 Ω Rg_off = 13 Ω | Rg_on = 2 Ω Rg_off = 2 Ω Les = 4 nH Res = 10 mΩ | Rg_on = 29 Ω Rg_off = 29 Ω |
| Voff_surge, V | 103 | 104 | 78 | 69 |
| di/dt_fall, kA/us | 2.0 | 2.0 | 1.3 | 1.3 |
| dv/dt_rise, kV/us | 48.0 | 21.5 | 47.0 | 11.3 |

In the first scenario, the converter system of the present disclosure uses a common stray inductance of 2 nH, resistance of 10 mΩ and 2Ω turn-on and turn-off gate resistors (Rg_on/Rg_off) to achieve a 1.6 kA/us di/dt for turn-on and 2.0 kA us for turn-off. To achieve a similar level di/dt control performance in a conventional solution, the turn-on and turn-off gate resistors (Rg_on/Rg_off) need to be as high as 16Ω and 13Ω, respectively. As a result, in the solution of the present disclosure, the turn-on switching loss (Eon) is decreased from 1.452 mJ to 0.885 mJ and the turn-off loss (Eoff) is decreased from 1.001 mJ to 0.802 mJ. Advantageously, in the solution of the present disclosure, these two switching losses have thus been decreased 39% and 20%, respectively, which decreases overall system power loss, decreases device junction temperature and decreases the design cost of the power semiconductor device and converter system.

Moreover, with the solution of the present disclosure, the turn-on delay (tdon) is advantageously decreased from 35.8 ns to 15.0 ns, while the turn-off delay (tdoff) is advantageously decreased from 432.3 ns to 184.4 ns, which is more than halved. A higher turn-on and turn-off delay will need high value bridge dead time in order to avoid short circuit which sacrifices the utility of converter input current, thus lower turn-on and turn-off delays are preferred.

Moreover, voltage transition speed (dv/dt_fall and dv/dt_rise) is advantageously increased when using the solution of the present disclosure.

In the comparison between the solution of the present disclosure and the conventional solution, switching current rise time (tr), fall time (tf) and turn-off surge voltage (Voff_surge) are kept substantially the same as these variables are directly related to the di/dt value which is kept the same in each scenario.

A similar comparison can be made between the solution of the present disclosure and the conventional solution based on columns 4 and 5 of Table 1 related to the second scenario (di/dt of 1.1-1.3 kA/us).

What is claimed is:

1. A power semiconductor device comprising:

a power semiconductor die forming a power switch and comprising an input pad, an output pad, and a control pad;

a collector power terminal coupled to the input pad of the power switch;

an auxiliary gate terminal coupled to the control pad of the power switch;

an emitter power terminal;

two or more inductance and resistance pairs, wherein each inductance and resistance pair comprises a common stray inductance and a resistance that are arranged in series between the output pad of the power switch and the emitter power terminal;

a plurality of auxiliary emitter terminals, wherein the auxiliary emitter terminals are coupled to both sides of the inductance and resistance pairs so that one auxiliary emitter terminal is coupled to one side of one inductance and resistance pair; and a diode, wherein one side of the diode is configured to be coupled to one side of a first of the inductance and resistance pairs, wherein the one side of the first of the inductance/and resistance pairs is coupled to an output pad of a power switch of a power semiconductor device, and wherein the other side of the diode is coupled to a gate drive power supply ground.

2. The power semiconductor device according to claim 1, wherein the common stray inductance and the resistance are formed by wire bonds and/or substrate copper tracks.

3. The power semiconductor device according to claim 1, wherein the common stray inductance has a first inductance value and/or the resistance has a first resistance value that is the same in different inductance and resistance pairs.

4. The power semiconductor device according to claim 1, wherein the common stray inductance has a second inductance value and/or the resistance has a second resistance value that is different in different inductance and resistance pairs.

5. The power semiconductor device according to claim 1, further comprising: a plurality of power semiconductor dies forming a plurality of power switches.

6. The power semiconductor device according to claim 1, further comprising:

a device package, wherein the collector power terminal, the auxiliary gate terminal, the emitter power terminal, and the plurality of auxiliary emitter terminals extend through the device package.

7. A control circuit for di/dt control of a power semiconductor device comprising: a power semiconductor die forming a power switch and comprising an input pad, an output pad, and a control pad;

a collector power terminal coupled to the input pad of the power switch; an auxiliary gate terminal coupled to the control pad of the power switch; an emitter power terminal;

two or more inductance and resistance pairs, wherein each inductance and resistance pair comprises a common stray inductance and a resistance that are arranged in series between the output pad of the power switch and the emitter power terminal;

a plurality of auxiliary emitter terminals, wherein the auxiliary emitter terminals are coupled to both sides of the inductance and resistance pairs so that one auxiliary emitter terminal is coupled to one side of one inductance and resistance pair, wherein the control circuit is configured to be coupled to a plurality of inductance and resistance pairs of the power semiconductor device, wherein the control circuit is configured to form a gate drive current return loop through an inductance and resistance pair, and wherein the control circuit is configured to select the inductance and resistance pair;

a plurality of electronic switches, wherein each electronic switch of the plurality of electronic switches is configured to be coupled to one side of one inductance and resistance pair;

an input configured to receive a di/dt selection input signal;

a demultiplexer circuit configured to receive the di/dt selection input signal via the input and coupled to the plurality of electronics switches; and one or more oscillation damp resistors coupled between the electronics switches and a gate drive power supply ground.

8. The control circuit according to claim 7, further comprising:

an input configured to receive a di/dt selection input signal;

a demultiplexer circuit configured to receive the di/dt selection input signal via the input and coupled to the plurality of electronics switches;

one or more oscillation damp resistors coupled between the electronics switches and a gate drive power supply ground; and a diode, wherein one side of the diode is configured to be coupled to one side of a first of the inductance and resistance pairs, wherein the one side of the first of the inductance and resistance pairs is coupled to an output pad of a power switch of the power semiconductor device, and wherein the other side of the diode is coupled to the gate drive power supply ground.

9. The control circuit according to claim 7, further comprising:

a first input configured to receive di/dt reference input signal;

a second input configured to receive a di/dt feedback signal;

a di/dt process logic circuit configured to receive the di/dt reference input signal via the first input;

a demultiplexer circuit coupled to the di/dt processing logic circuit and coupled to the plurality of electronics switches;

one or more oscillation damp resistors coupled between the electronics switches and a gate drive power supply ground;

a di/dt detect circuit configured to receive the di/dt feedback signal via the second input and configured to be coupled to one side of a first of the inductance and resistance pairs, wherein the one side of the first of the inductance and resistance pairs is coupled to an output pad of a power switch of the power semiconductor device; and an error amplify circuit configured to receive the di/dt reference input signal via the first input and configured to receive the di/dt feedback signal via the second input, wherein the error amplify circuit is coupled to a gate drive circuit for gate drive level close loop di/dt control.

10. An electronic device comprising:

a power semiconductor device comprising:

a power semiconductor die forming a power switch and comprising an input pad, an output pad, and a control pad, a collector power terminal coupled to the input pad of the power switch, an auxiliary gate terminal coupled to the control pad of the power switch, an emitter power terminal, two or more inductance and resistance pairs, wherein each inductance and resistance pair comprises a common stray inductance and a resistance that are arranged in series between the output pad of the power switch and the emitter power terminal, a plurality of auxiliary emitter terminals, wherein the auxiliary emitter terminals are coupled to both sides of the inductance and resistance pairs so that one auxiliary emitter terminal is coupled to one side of one inductance and resistance pair; and a control circuit comprising a plurality of electronic switches, wherein each electronic switch of the plurality of electronic switches is configured to be coupled to one side of one inductance and resistance pair, wherein the control circuit is configured to be coupled to a plurality of inductance and resistance pairs of the power semiconductor device, wherein the control circuit is configured to form a gate drive current return loop through an inductance and resistance pair, and wherein the control circuit is configured to select the inductance and resistance pair.

11. The electronic device according to claim 10, further comprising: a gate drive circuit configured to be coupled to an input pad and a control pad of a power switch of the power semiconductor device.

12. The electronic device according to claim 10, wherein the control circuit further comprises:

an input configured to receive a di/dt selection input signal;

a demultiplexer circuit configured to receive the di/dt selection input signal via the input and coupled to the plurality of electronic switches; and one or more oscillation damp resistors coupled between the electronics switches and a gate drive power supply ground.

13. The electronic device according to claim 10, wherein the control circuit further comprises:

an input configured to receive a di/dt selection input signal;

a demultiplexer circuit configured to receive the di/dt selection input signal via the input and coupled to the plurality of electronic switches;

one or more oscillation damp resistors coupled between the electronics switches and a gate drive power supply ground; and a diode, wherein one side of the diode is configured to be coupled to one side of a first of the inductance and resistance pairs, wherein the one side of the first of the inductance and resistance pairs is coupled to an output pad of a power switch of the power semiconductor device, and wherein the other side of the diode is coupled to the gate drive power supply ground.

14. The electronic device according to claim 10, wherein the control circuit further comprises:

a first input configured to receive di/dt reference input signal;

a second input configured to receive a di/dt feedback signal;

a di/dt process logic circuit configured to receive the di/dt reference input signal via the first input;

a demultiplexer circuit coupled to the di/dt processing logic circuit and coupled to the plurality of electronic switches;

one or more oscillation damp resistors coupled between the electronics switches and a gate drive power supply ground;

a di/dt detect circuit configured to receive the di/dt feedback signal via the second input and configured to be coupled to one side of a first of the inductance/resistance pairs, wherein the one side of the first of the inductance and resistance pairs is coupled to an output pad of a power switch of the power semiconductor device; and an error amplify circuit configured to receive the di/dt reference input signal via the first input and configured to receive the di/dt feedback signal via the second input, wherein the error amplify circuit is coupled to a gate drive circuit for gate drive level close loop di/dt control.

* * * * *